United States Patent
Huang

(10) Patent No.: US 9,431,562 B2
(45) Date of Patent: Aug. 30, 2016

(54) THREE DIMENSIONAL COMPOSITIONAL PROFILE IN CIS-BASED ABSORBER LAYERS OF THIN FILM SOLAR CELLS

(71) Applicant: TSMC SOLAR LTD., Taichung (TW)

(72) Inventor: Chien Yao Huang, New Tapei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 123 days.

(21) Appl. No.: 14/159,468

(22) Filed: Jan. 21, 2014

(65) Prior Publication Data
US 2015/0207010 A1    Jul. 23, 2015

(51) Int. Cl.
H01L 31/065    (2012.01)
H01L 31/032    (2006.01)
H01L 31/0749    (2012.01)
H01L 21/02    (2006.01)

(52) U.S. Cl.
CPC ......... *H01L 31/065* (2013.01); *H01L 21/0251* (2013.01); *H01L 21/02485* (2013.01); *H01L 21/02568* (2013.01); *H01L 21/02587* (2013.01); *H01L 21/02614* (2013.01); *H01L 21/02631* (2013.01); *H01L 31/0322* (2013.01); *H01L 31/0749* (2013.01); *Y02E 10/50* (2013.01)

(58) Field of Classification Search
None
See application file for complete search history.

(56) References Cited

U.S. PATENT DOCUMENTS 9,064,993 B2 *    6/2015    Oomae et al.

FOREIGN PATENT DOCUMENTS

WO    WO 2012165500 A1 *    12/2012    ............. H01L 31/04

* cited by examiner

*Primary Examiner* — Andres Munoz
(74) *Attorney, Agent, or Firm* — Duane Morris LLP

(57) ABSTRACT

Provided is a structure and method for forming CIS-based absorber layers for thin-film solar cells that include three-dimensional compositional profiles. The disclosure provides a patterned absorber layer with two or more different regions, each of the regions having a different concentration profile of one or more components. In some embodiments, the different regions have different respective GGI profiles. GGI represents an atomic ratio of Ga/(Ga+In) in CIS-based absorber materials and in some embodiments the two or more different regions have GGI gradients from top to bottom of the CIS-based absorber layer. The method includes using two evaporation sources in a co-evaporation system to produce the two or more different regions adjacent one another on a substrate.

17 Claims, 6 Drawing Sheets

THREE DIMENSIONAL COMPOSITIONAL PROFILE IN CIS-BASED ABSORBER LAYERS OF THIN FILM SOLAR CELLS

BACKGROUND

The disclosure relates to solar cells and methods for manufacturing the same, and more particularly to solar cells with CIS-based absorber layers. Solar cells are photovoltaic components for direct generation of electrical current from sunlight. Due to the growing demand for clean sources of energy, the manufacture of solar cells has expanded dramatically in recent years. The absorber layer of the solar cell absorbs photons from light and converts the photons of the solar energy directly into electricity and the absorber layer is therefore important in the functionality of a solar cell.

CIS-based absorber layers are popular absorber layers in solar cells. CIS-based absorber layers are pentameric Cu-III-VI$_2$ alloy systems that include copper, a group III element such as indium, In, and gallium, Ga, and a group VI element such as selenium, Se, and sulfur, S. Examples of CIS-based absorbers include selenides such as CuInSe$_2$ and Cu(InGa)Se$_2$, sulfides like CuInS$_2$ and Cu(InGa)S$_2$ and composite CIS-based absorbers such as Cu(InGa)(Se,S)$_2$ compounds.

Some absorber layers, including CIS-based absorber layers, have a gradient of one of their components from the top to the bottom of the film, and the gradient represents a one-dimensional distribution of a component or a ratio from the film top to the film bottom.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
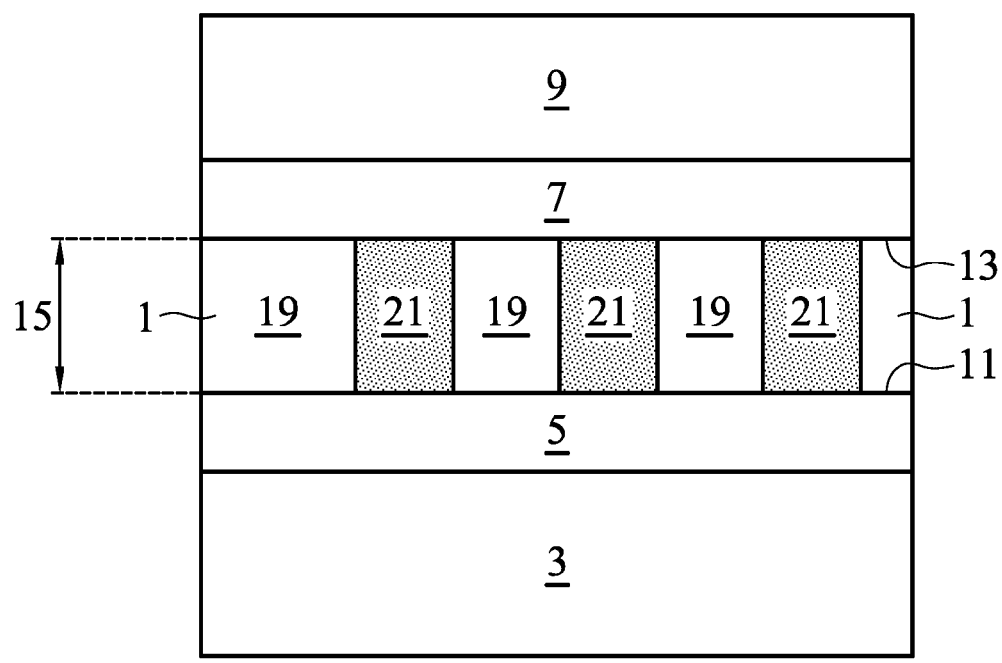
FIG. 1 is a cross-sectional view of a solar cell with an absorber layer in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The disclosure provides solar cells and methods for forming solar cells. More particularly, the disclosure provides an absorber layer that includes a three dimensional profile. The absorber layer is a thin film formed over a substrate and is patterned and includes at least two different types of regions. In some embodiments, the different regions include the same compositional materials but differ in the profile of the concentration or ratio of one or more materials, from the top to the bottom of the absorber layer. In some embodiments, the absorber layer is a CIS-based absorber layer for a thin film solar cell. CIS-based absorber layers are pentameric Cu III VI2 alloy systems that include copper, a group III element such as indium, In, and gallium, Ga, and a group VI element such as selenium, Se, and sulfur, S. Examples of CIS based absorbers include selenides such as CuInSe2 and Cu(InGa)Se2, sulfides like CuInS2 and Cu(InGa)S2 and composite CIS-based absorbers such as Cu(InGa)(Se,S)2 compounds.

GGI represents the atomic ratio of Ga/(Ga+In) in CIS-based absorber layers that include gallium and indium. In some embodiments, the GGI profile from the top to the bottom of the thin film, CIS-based absorber layer, is different in the different regions. In some embodiments the GGI profile is a gradient from the top to the bottom of the CIS-based absorber layer, and the GGI profiles differ in the different regions of the CIS-based absorber layer. Increased GGI ratio increases band gap of CIS-based absorber layers in some embodiments. Increased GGI ratio increases conduction band minimum (Ec), i.e. the minimum energy level in the conduction band, in CIS-based absorber layers in some embodiments. The three dimensional profile is created because the GGI profile in some regions is different than the GGI profile in other regions.

Although the disclosure will be discussed primarily with respect to CIS-based absorber layers and the GGI profile in the same, it should be understood that these examples are provided for illustration only and that the disclosure finds application in CIS-based solar cells in which concentration gradients or profiles of various other components are varied in different sections. The disclosure also finds application in other absorber layer types in which two or more regions are present, with first regions having different compositional profiles of one or more materials from the top to the bottom of the film. In some embodiments, the first and second regions that make up the absorber layer are all formed of the same materials and include a profile of concentration or a relative amount of one or materials from top to bottom. These profiles are gradients of a concentration or ratio of a material in some embodiments and in some embodiments, these gradients differ in the different regions. In some embodiments, more than two different regions are provided.

Now addressing to the embodiment of three dimensional GGI profile in CIS-based absorber layers, the three dimensional GGI profile according to the disclosure spatially reduces recombination loss in the depletion region and improves recombination current ($J_o$). The recombination current ($J_o$) is the current resulting from the flow of electrons and holes pairs that recombine in the region of a forward biased p-n junction in a solar cell. The three dimensional GGI profile also provides 3-D minority carrier transportation paths and improves minority carrier collection. These features provide many advantages in CIS-based absorber layers including but not limited to improved open circuit voltage (Voc) and improved fill factor (FF). The open circuit voltage (Voc) is defined as the voltage across a solar cell under AM1.5G spectrum illumination when the output current is zero. The open circuit voltage (Voc) means the possible maximum voltage across a solar cell under operation. The FF is defined as the ratio of the maximum power from the solar cell to the product of Voc and Isc. The fill factor (FF) is a parameter to describe the "squareness" of an I-V curve of a solar cell. Moreover, the higher FF means lower power loss via shunting loss, series resistance loss, and recombination loss in p-n junction.

FIG. 1 is a cross-sectional view showing a stack of films used in a thin film solar cell according to some embodiments of the disclosure. Absorber layer 1 is formed over substrate 3 with back electrode layer 5 disposed between substrate 3 and absorber layer 1. Buffer layer 7 is formed over absorber layer 1 and widow layer 9 is disposed over buffer layer 7 but other arrangements of films are used in other embodiments of the disclosure.

Absorber layer 1 includes bottom surface 11 and top surface 13 and thickness 15 which may range from about 0.5 um to about 0.3 um in various embodiments of the disclosure. Absorber layer 1 includes multiple first regions 19 and multiple second regions 21 in the cross-sectional view. First regions 19 differ from second regions 21 because they have different profiles of one or more materials along the direction from bottom surface 11 to top surface 13. In some embodiments, first regions 19 and second regions 21 are formed of the same components and in other embodiments they are formed of different components. According to some embodiments, one or both of first regions 19 and second regions 21 include a concentration or relative amount of one or more materials, that varies from bottom surface 11 to top surface 13, i.e. one or both of first regions 19 and second regions 21 include a concentration gradient from top to bottom. In some embodiments, one of first regions 19 and second regions 21 has a constant profile of the subject material. According to either embodiment, the profile of one or more materials in first regions 19 differs from the profile of one or more materials in second regions 21.

In some embodiments, absorber layer 1 is a CIS-based absorber layer as described above. In some embodiments, absorber layer 1 includes copper, indium, gallium, and at least one of selenium and sulfur. In some embodiments, the compositional profile is the atomic ratio GGI and in some embodiments there is a GGI gradient from bottom surface 11 to top surface 13 in the first regions 19 and in other embodiments, the GGI profile from bottom surface 11 to top surface 13 is constant in first regions 19. In some embodiments, there is a GGI gradient from bottom surface 11 to top surface 13 in second regions 21 and in other embodiments, the GGI profile from bottom surface 11 to top surface 13 is constant in second regions 21. The GGI profile in first regions 19 is different than the GGI profile in second regions 21. In some embodiments, there are GGI gradients in each of first regions 19 and second regions 21 and the GGI gradients differ between first regions 19 and second regions 21. In some embodiments, the GGI profile is the same in all first regions 19. In some embodiments, the GGI profile is the same in all second regions 21.

In other embodiments, absorber layer 1 is forms of different materials and the components included within first regions 19 and second regions 21 are the same with the first regions 19 being distinguished from second regions 21 because the regions include different concentration profiles or different material ratios that vary from bottom surface 11 to top surface 13 differently in the different regions.

Figure 2:
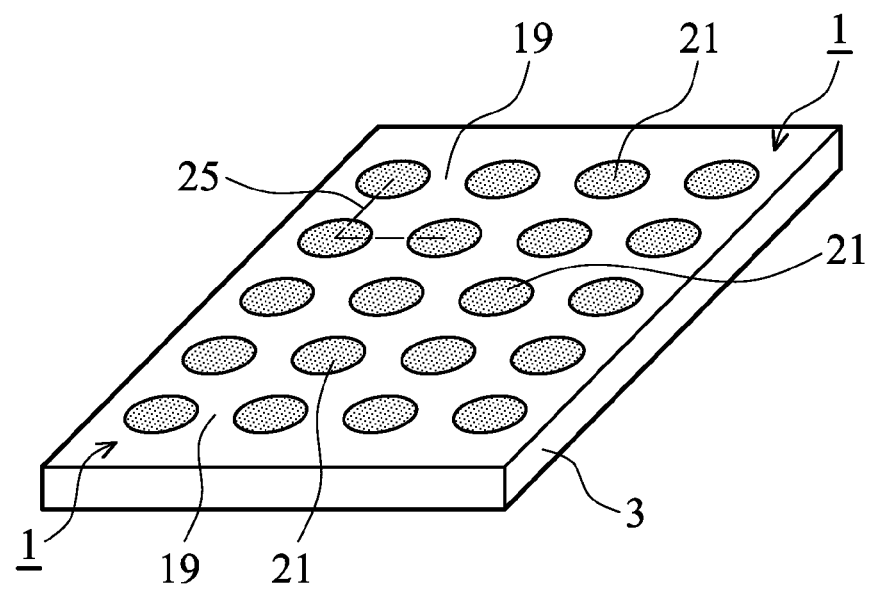
FIG. 2 is a perspective view of an absorber layer of a solar cell in accordance with some embodiments of the disclosure.

Although multiple first regions 19 appear in the cross-sectional view of FIG. 1, in some embodiments, the discrete first regions 19 shown in the cross-section of FIG. 1, are part of a single first region 19 that includes second regions 21 disposed therein, as in FIG. 2

FIG. 2 is a perspective view of a solar cell according to various embodiments of the disclosure. Absorber layer 1 is disposed over substrate 3. Absorber layer 1 includes first regions 19 and second regions 21 that form a horizontal pattern with respect to substrate 3 over which absorber layer 1 is disposed. In the perspective view of FIG. 2, first region 19 is a bulk region that extends throughout absorber layer 1 and absorber layer 1 is defined by a plurality of second regions 21 that are surrounded by first region 19. Second regions 21 take on various shapes in various embodiments and the circular shape shown in FIG. 2 is just one embodiment. In other embodiments, second region 21 is rectilinear, ellipsoidal, parabolic or takes on various other shapes. In some embodiments, second region 21 include sections with different shapes. Other arrangements of first and second regions are shown in other embodiments. In FIG. 2, second regions 21 form a periodic, i.e. regular repeating pattern within absorber layer 1 but in other embodiments, different, non-regular patterns are used. Spacing 25 between adjacent second regions varies from about 0.1 um to about 1000 um in various embodiments and depends to some extent on the overall dimensions of the solar cell which varies in various embodiments. In other embodiments, spacing 25 like the pattern itself, is not periodic and the pattern on absorber layer 1 includes first and second regions having different shapes with the different regions spaced variously with respect to one another. In some embodiments, additional regions are present in addition to first regions 19 and second regions 21.

Figure 3A:
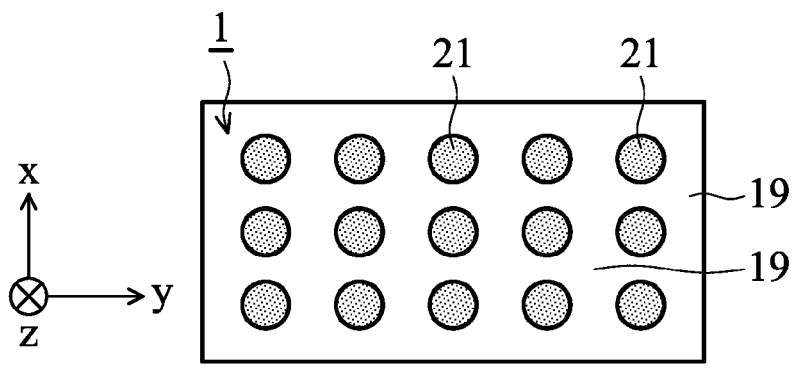
FIG. 3a is a top, plan view of a CIS-based absorber layer in accordance with some embodiments of the disclosure.
Figure 3B:
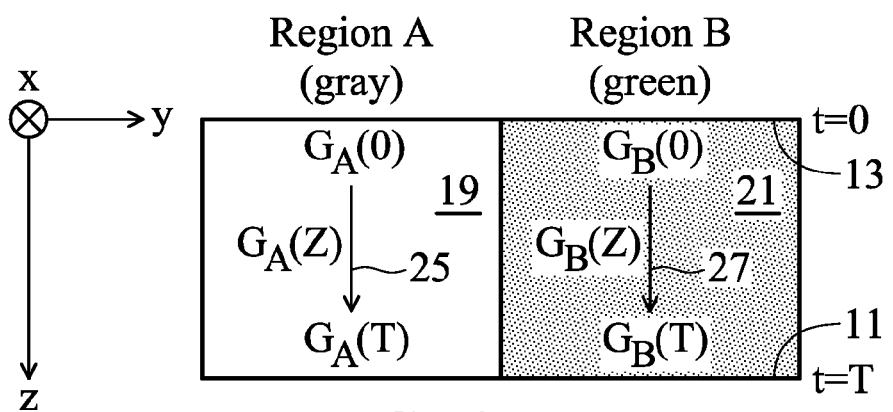
FIG. 3b is a cross-sectional view of a portion of a CIS-based absorber layer of FIG. 3a, and FIG. 3c is a cross-sectional view showing a gradient profile of components of a CIS-based absorber layer in accordance with some embodiments of the disclosure.

FIG. 3A is a top view of an absorber layer 1 according to some embodiments of the disclosure and also provides an x, y, z coordinate system for ease of explanation. Absorber layer 1 includes first region 19 and second regions 21 forming a pattern in the x,y plane of absorber layer 1 and is formed over a substrate such as shown in FIG. 1. FIGS. 3A and 3B are cross-sections of one first region 19 adjacent one second region 21 as may be taken from one location on absorber layer 1 shown in FIG. 3A. $G_{A,B(z)}$ represents GGI (the ratio of Ga/(Ga+In)) as a function of distance along the z axis, i.e. the distance from top surface 13 to bottom surface 11, in first region 19 and second region 21, respectively. In some embodiments, both $G_{A(z)}$ and $G_{B(z)}$ increase from top surface 13 to bottom surface 11, i.e. along directions 25 and 27, respectively and in some embodiments, the converse is true. In these embodiments, there is a GGI gradient in each of first regions 19 and second regions 21. In other embodiments, the GGI profile is constant in either first regions 19 or second regions 21. According to one embodiment in which both first region 19 and second regions 21 include concentration gradients, the percentage of gallium as defined by the Ga/(Ga+In) relationship, increases along directions 25, 27. In other embodiments, the converse is true and in still other embodiments, $G_{A(z)}$ increases along direction 25 and $G_{B(z)}$ decreases along direction 27 and in still other embodiments, the opposite is the case. In some embodiments, $G_{A(z)}$ is greater than $G_{B(z)}$ and in other embodiments, $G_{A(z)}$ is less than $G_{B(z)}$ and but in each embodiment, $G_{A(z)}$ differs from $G_{B(z)}$.

Figure 3C:
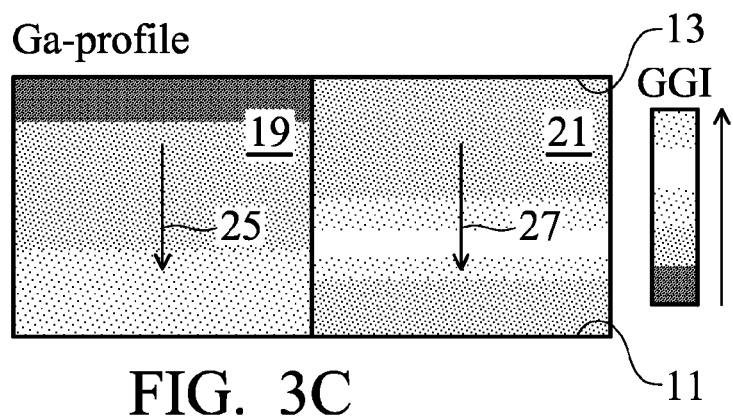

FIG. 3C shows a gradient of Ga concentration along direction 25 in first region 19 and along direction 27 in second region 21, with the different shading in first regions 19 and second regions 21 indicative of different GGI values, i.e. different concentrations of Ga and different ratios of Ga/(Ga+In). In some embodiments, both $G_{A(z)}$ in first region 19 and $G_{B(z)}$ in second region 21 i.e. the GGI ratios, increase from top surface 13 to bottom surface 11. In the illustration embodiment, $G_{A(z)} < G_{B(z)}$ i.e., the increase of GGI as a function of distance z is greater in second regions 21 than in first region 19. In other embodiments, $G_{A(z)} > G_{B(z)}$. In either embodiment $G_{A(z)} \neq G_{B(z)}$. The degree by which $G_{A(z)}$ and $G_{B(z)}$ differ, varies in various embodiments of the disclosure.

Figure 4:
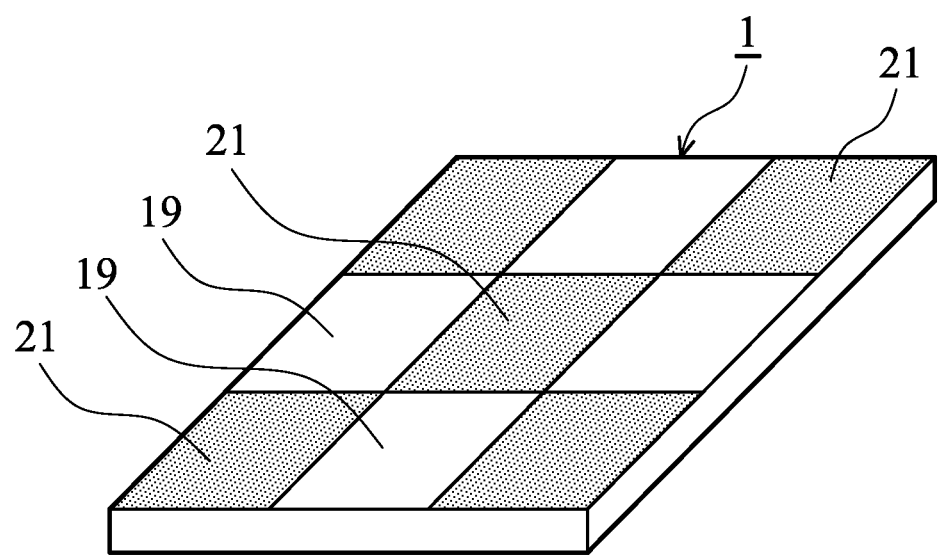
FIG. 4 is a perspective view of an absorber layer in accordance with some embodiments of the disclosure.

FIG. 4 shows an absorber layer 1 having a different pattern of first portions 19 and second portions 21 according to some embodiments of the disclosure. In FIG. 4, each of first regions 19 and second regions 21 is rectangular in shape and they form a checkerboard-type pattern in absorber layer 1. In FIG. 4, first regions 19 and second regions 21 are each the same size but in other embodiments, first regions 21 and second regions 22 are sized differently and in other embodiments, the pattern of first regions 21 and second regions 22 is not a regular, repeating pattern as in FIG. 4. In still other embodiments, one or both of first regions 19 and second regions 21 take on different shapes.

Figure 5:
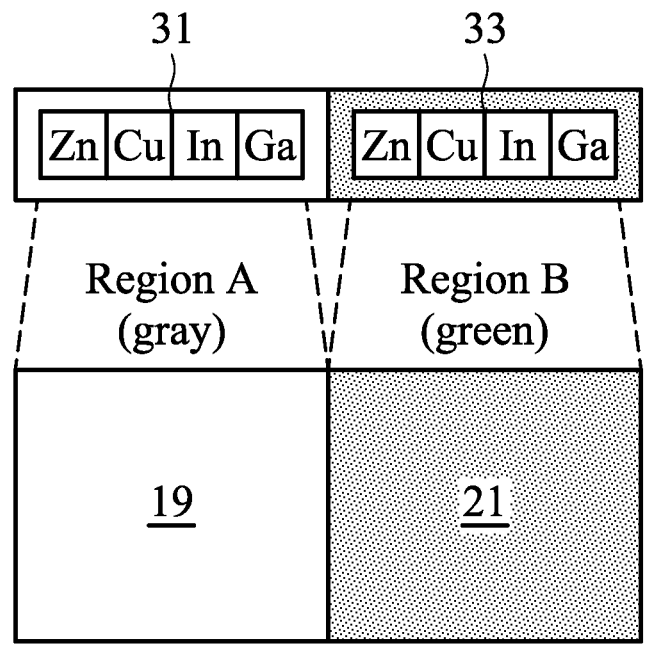
FIG. 5 is a schematic view illustrating two evaporation sources used to form different regions of an absorber layer in accordance with some embodiments of the disclosure.
Figure 5:
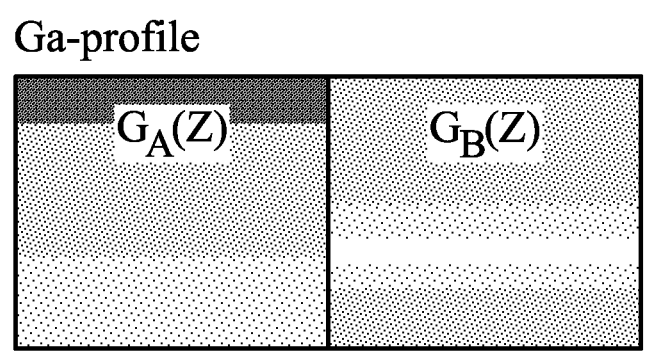

FIG. 5 is a schematic view showing two evaporation sources such as may be disposed in a co-evaporation apparatus used to form respective first regions 19 and second regions 21 as previously described. Evaporation source 31 is used to form first regions 19 and evaporation source 33 is used to form second regions 21. In some embodiments, evaporation sources 31 and 33 are disposed adjacent one another in a co-evaporation apparatus. In other embodiments, evaporation sources 31 and 33 are arranged differently but configured to deposit respective first regions 19 and second regions 21 adjacent one another. In some embodiments, evaporation sources 31 and 33 include the same components such as the components Se, Cu, In and Ga such as shown in FIG. 5. In some embodiments, evaporation sources 31 and 33 include different percentages of the components they have in common. In some embodiments, evaporation sources 31 and 33 include different components.

The method for forming the absorber layer according to the disclosure includes first forming the absorber layer by deposition such as evaporation. Various systems that accommodate co-evaporation with multiple evaporation sources are used. Various evaporation conditions are used in various embodiments of the disclosure. In some embodiments, different powers are applied to evaporation sources 31 and 33 to form first regions 19 and second regions 21 to differ from one another. In some embodiments, the powers or other evaporation conditions are varied throughout the evaporation process and are varied differently throughout the evaporation process for evaporation sources 31 and 33 to produce first 19 and second regions 21, respectively with different GGI profiles. In some embodiments, first regions 19 and second regions 21 are formed to include different GGI profiles $G_{A(z)}$ and $G_{B(z)}$, respectively, by varying the evaporation parameters differently for co-evaporation source 31 and co-evaporation source 33 during the course of the evaporation process. Various methods are used in various embodiments to form first regions 19 adjacent second regions 21 from the different evaporation sources 31, 33, respectively such that first regions 19 have different GGI profiles $G_{A(z)}$ and $G_{B(z)}$.

In some embodiments, the evaporation using evaporation source 31 takes place at the same time as the evaporation using evaporation source 33 and in other embodiments, the evaporation from evaporation source 31 and evaporation source 33 take place at different times and may be sequential.

Figure 6:
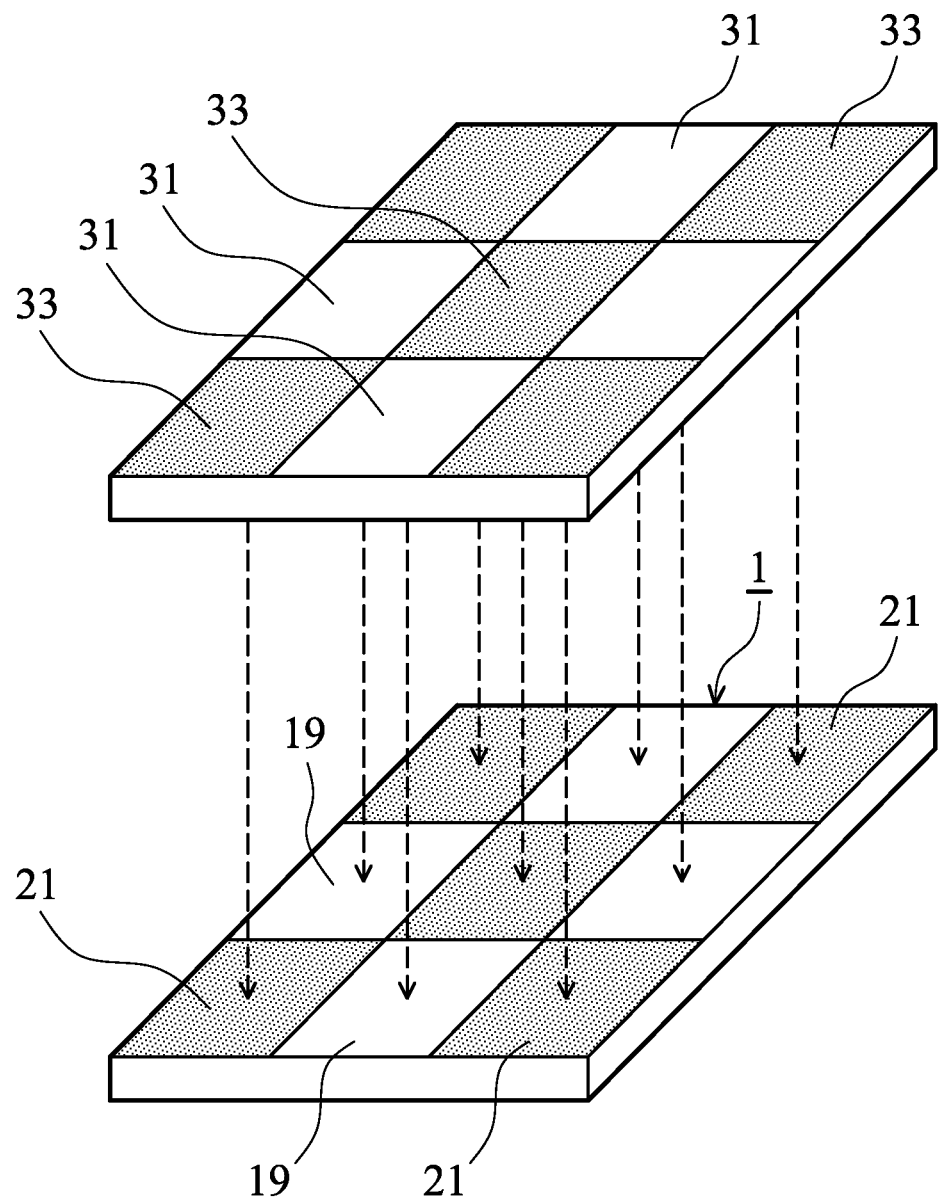
FIG. 6 is a plan view illustrating two evaporation sources used to form different regions of an absorber layer in accordance with some embodiments of the disclosure.

FIG. 6 is a perspective view showing multiple co-evaporation sources 31, 33 arranged within a co-evaporation apparatus to produce corresponding first regions 19 and second regions 21 in some embodiments of the disclosure. Evaporation from evaporation sources 31, 33 to produce corresponding first regions 19 and second regions 21 is indicated by directional evaporation arrows 37. Other arrangement are used in other embodiments. A co-evaporation operation or operations take place to form a CIGS absorber layer that includes Cu, In, Ga and Se, and includes first regions 19 and second regions 21 with different GGI profiles $G_{A(z)}$ and $G_{B(z)}$ respectively. Subsequently, a sulfurization treatment process is carried out in some embodiments of the disclosure. The sulfurization treatment process applied to the absorber layer converts the CIGS absorber layer (copper, indium, gallium, selenium) to a CIGSS absorber layer (copper, indium, gallium, selenium, sulfur) with the pattern including first regions 19 and second regions 21 with different GGI profiles, as described above. The sulfurization process includes a treatment in which the solar cell is disposed within a treatment chamber in an atmosphere that includes a sulfur source. Various temperatures and other treatment conditions are used in other embodiments.

Figure 7:
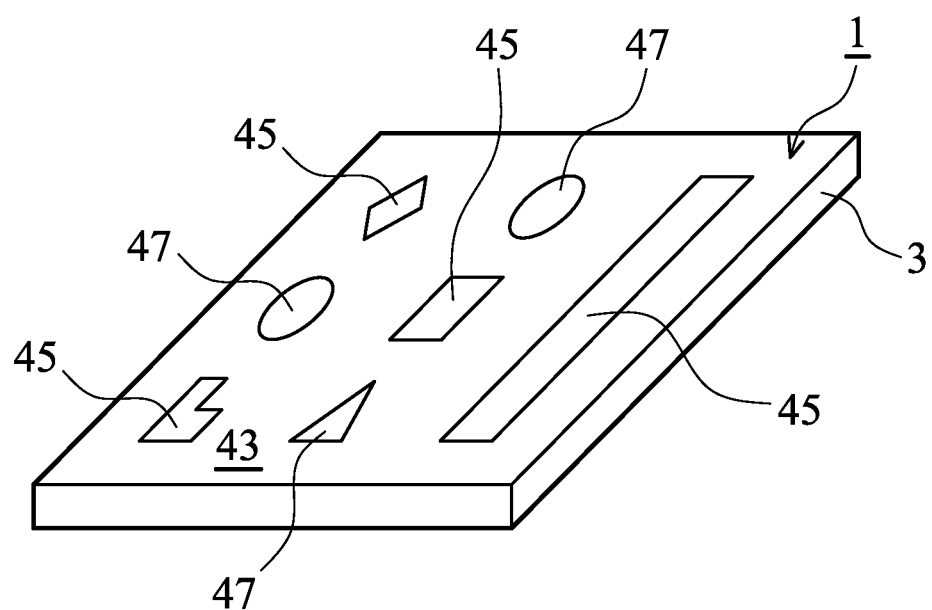
FIG. 7 is a perspective view of an absorber layer in accordance with some embodiments of the disclosure.

FIG. 7 shows an absorber layer according to other embodiments of the disclosure. Absorber layer 41 is formed on substrate 3 and is patterned to include multiple different regions. Absorber layer 41 includes first region 43, second regions 45 and third regions 47. Absorber layer 41 is a CIS-based absorber layer in some embodiments. In some embodiments, each of first regions 43, second regions 45 and third regions 47 include different concentration profiles of one or more components, from the top of absorber layer 41 to the bottom of absorber layer 41. It can be seen that second regions 45 and second regions 47 have different shapes. Second regions 45 themselves have different shapes and second regions 47 themselves have different shapes. The relative sizes of first region 41, second regions 45 and third regions 47 vary in various embodiments. In some embodiments, absorber layer 41 is formed of the same components throughout the different regions and the respective regions 43, 45, 47, differ from one another by the concentration gradient of one or more components of absorber layer 41. In other embodiments, first regions 43, second regions 45 and second regions 47 are formed of different components.

The disclosed absorber layers provide a reduced recombination loss and improved J0 which result in $V_{oc}$ and FF improvement. The three dimensional nature of the GGI profiles according to some CIS-based absorber layer embodiments, includes a high GGI profile, i.e., a high $G_B(z)$ that, combined with portions with different GGI profiles, spatially reduces recombination loss in the depletion region by providing a larger band gap as compared to conventional one dimensional GGI profiles. The three dimensional GGI profile advantageously provides a three dimensional back surface field (BSF), which enables increased minority carrier transportation pads and improved carrier collection compared to conventional CIS-based absorber layers. The improved minority carrier collection results in improved photo-generated current Jph(V) at high voltage thereby increasing the efficiency of the solar cell. The higher photo-generated current Jph(V) at high voltage means higher carrier collection rate when the solar cell is operated at maximum power point. Therefore the higher photo-generated current Jph(V) at high voltage improves open-circuit voltage (Voc) and fill factor (FF).

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

In some embodiments, a solar cell is provided. The solar cell comprises: a substrate and an absorber layer disposed over the substrate. The absorber layer has a bottom surface and a top surface and a horizontal pattern including at least one first region and a plurality of second regions, the first and second regions having different compositional profiles from the bottom surface to the top surface.

In some embodiments, a solar cell is provided. The solar cell comprises a CIS-based absorber layer disposed over the substrate. The CIS-based absorber layer has a bottom surface and a top surface and a horizontal pattern including at least one first region and a plurality of second regions, the first and second regions having different compositional profiles from the bottom surface to the top surface.

In some embodiments, a method for forming a solar cell is provided. The method for comprises disposing a substrate in a co-evaporation apparatus; forming a patterned CIS-based absorber layer over the substrate by: first evaporating using a first evaporation source to form at least one first region with a first compositional profile in at least one first portion of the substrate, and second evaporating using a second evaporation source to form a plurality of second regions each with a second compositional profile, each said second region in a corresponding second portion of the substrate. Each first region and each of the plurality of second regions include common components and the first compositional profile differs from the second compositional profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A solar cell comprising:
a substrate;
a Cu—In—Se-based absorber layer disposed over said substrate, said Cu—In—Se-based absorber layer having a bottom surface and a top surface and a horizontal pattern including at least one first region and a plurality of second regions, said at least one first region and said plurality of second regions having different compositional profiles from said bottom surface to said top surface,
wherein, in each of said at least one first region and each of said plurality of second regions, said different compositional profiles are a gradient of an atomic ratio of Ga/(Ga+In) that increases from said top surface to said bottom surface.

2. The solar cell as in claim 1, wherein said at least one first region has a first compositional profile, and said plurality of second regions have a second compositional profile, the solar cell further comprising a plurality of third regions, wherein each of said plurality of third regions has a third compositional profile, wherein each of said first compositional profile, second compositional profile and third compositional profile differ from one another.

3. The solar cell as in claim 1, wherein said at least one first region and said plurality of second regions are formed of the same components.

4. The solar cell as in claim 1, wherein said Cu—In—Se-based absorber layer comprises a pentanary Cu-III-VI$_2$ alloy material and said at least one first region and said plurality of second regions are each formed of the same components including at least Cu, In, Ga and Se.

5. The solar cell as in claim 1, wherein said at least one first region comprises a plurality of first regions and said plurality of first regions and said plurality of second regions are rectangular in shape and arranged in a checkerboard pattern.

6. The solar cell as in claim 1, wherein said plurality of second regions comprise discrete second regions and said at least one first region comprises one bulk first region that occupies all other portions of said Cu—In—Se-based absorber layer unoccupied by said discrete second regions.

7. The solar cell as in claim 1, further comprising a back electrode layer disposed between said substrate and said Cu—In—Se-based absorber layer, a buffer layer disposed over said Cu—In—Se-based absorber layer, and a window layer disposed over said buffer layer.

8. The solar cell as in claim 1, wherein said at least one first region comprises a plurality of first regions and said horizontal pattern is a periodic pattern of said at least one first region and said plurality of second regions.

9. A method for forming the solar cell of claim 6 comprising:
forming the Cu—In—Se-based absorber layer over the substrate in a co-evaporation apparatus by:
evaporating a first evaporation source to form the at least one first region with a first one of the different compositional profiles in at least one first portion of said substrate, and
evaporating a second evaporation source to form said plurality of second regions each with a second one of the different compositional profiles, each of said plurality of second regions in a corresponding second portion of said substrate,
wherein said first one of the different compositional profiles differs from said second one of the different compositional profiles.

10. The method as in claim 9, wherein said first one of the different compositional profiles is a first gradient of an atomic ratio of Ga/(Ga+In) from a top surface to a bottom surface of said Cu—In—Se-based absorber layer and said second one of the different compositional profiles is a second gradient of an atomic ratio of Ga/(Ga+In) from said top surface to said bottom surface of said Cu—In—Se-based absorber layer.

11. The method as in claim 9, wherein said at least one first region and each of said plurality of second regions are disposed at different lateral locations of said Cu—In—Se-based absorber layer.

12. The method as in claim 9, wherein said substrate includes a back electrode layer thereon and said step of forming said Cu—In—Se-based absorber layer over said substrate comprises forming said Cu—In—Se-based absorber layer on said back electrode layer and further comprises,
forming a buffer layer over said Cu—In—Se-based absorber layer and a window layer over said buffer layer.

13. The method as in claim 9, further comprising treating said Cu—In—Se-based absorber layer with sulfur in a sulfurization process and wherein said step of evaporating the first evaporation source and said step of evaporating the second evaporation source take place simultaneously.

14. The method as in claim 9, wherein said plurality of second regions are each circular in shape and are positioned periodically on said Cu—In—Se-based absorber layer.

15. A solar cell comprising:
a substrate;
a back electrode layer disposed above the substrate;
a buffer layer disposed above the back electrode layer;
a window layer disposed above the buffer layer; and
a Cu—In—Se-based absorber layer disposed between the back electrode layer and the buffer layer,
wherein the Cu—In—Se-based absorber layer has a first surface, a second surface, a plurality of first regions and a plurality of second regions,
wherein the plurality of first regions and the plurality of second regions have different compositional profiles from the first surface to the second surface,
wherein, in each of the plurality of first regions and each of the plurality of second regions, the different compositional profiles are a gradient of an atomic ratio of Ga/(Ga+In) that increases from the first surface to the second surface.

16. The solar cell in claim 15, further comprising:
a pentanary Cu-III-VI$_2$ alloy material for the Cu—In—Se-based absorber layer, wherein the plurality of first regions and the plurality of second regions are each formed of a same set of components including at least Cu, In, Ga and Se.

17. The solar cell of claim 15, wherein the plurality of second regions include discrete second regions, wherein the plurality of first regions comprise one bulk first region that occupies all other portions of said Cu—In—Se-based absorber layer unoccupied by the discrete second regions.

* * * * *